US006377467B1

(12) United States Patent
Chu et al.

(10) Patent No.: US 6,377,467 B1
(45) Date of Patent: Apr. 23, 2002

(54) SURFACE MOUNTABLE OVER-CURRENT PROTECTING DEVICE

(75) Inventors: Fu-Hua Chu, Taipei; Yun-Ching Ma, Taipei Hsien; David Shau-Chew Wang, Taipei, all of (TW)

(73) Assignee: Polytronics Technology Corporation, Hsinchu (TW)

( * ) Notice: Subject to any disclaimer, the term of this patent is extended or adjusted under 35 U.S.C. 154(b) by 0 days.

(21) Appl. No.: 09/542,283

(22) Filed: Apr. 4, 2000

(30) Foreign Application Priority Data

Apr. 26, 1999 (TW) ........................................ 088206474

(51) Int. Cl.[7] .................................................. H05K 7/00

(52) U.S. Cl. ....................... 361/767; 361/746; 361/790; 361/704; 428/901

(58) Field of Search ................................ 361/767, 704, 361/679, 746, 790, 793, 802, 807, 794; 428/209, 901, 210, 214; 338/312, 313, 314, 318, 308, 307, 309, 328, 329, 331, 332

(56) References Cited

U.S. PATENT DOCUMENTS 5,025,271 A * 6/1991 Baker et al. ................ 346/140
5,089,801 A 2/1992 Chan et al. ............... 338/22 R
5,699,607 A * 12/1997 McGuire et al. .............. 29/612
5,831,510 A 11/1998 Zhang et al. ............ 338/22 R
5,852,397 A 12/1998 Chan et al. ............... 338/22 R
5,864,281 A 1/1999 Zhang et al. ............ 338/22 R
5,876,842 A * 3/1999 Duffy et al. ................ 428/209
5,884,391 A * 3/1999 McGuire et al. .............. 29/612
5,900,800 A * 5/1999 McGuire et al. .......... 338/22 R
6,023,403 A 2/2000 McGuire et al. ............ 361/106

* cited by examiner

*Primary Examiner*—Jeffrey Gaffin
*Assistant Examiner*—Hung Bui
(74) *Attorney, Agent, or Firm*—Kenyon & Kenyon

(57) ABSTRACT

The present invention relates to a novel thermal-sensitive resistive apparatus, such as PTC and NTC, which allocates planar electrode films on the top and bottom surfaces of a prior art thermal-sensitive resistive apparatus, such as a PTC apparatus, to laminate with an outer electrode layer. A plurality of interconnection vias are electroplated with conductive material to connect to any plane. It is convenient to surface mount the apparatus of the present invention on a printed circuit board. The present invention can largely increase the dimensional stability of components and overcome the disadvantage that thermal diffusion of the prior are surface mounted resistive apparatus is affected easily by line width and environments.

20 Claims, 2 Drawing Sheets

SURFACE MOUNTABLE OVER-CURRENT PROTECTING DEVICE

BACKGROUND OF THE INVENTION

1. Field of the Invention

The present invention relates to a surface-mounted thermal-sensitive resistance apparatus, such as a positive-temperature-coefficient (PTC) or negative-temperature-coefficient (NTC) element, which is mainly applied to a printed circuit board (PCB) for sensing overloading current and abnormal temperature variation to protect elements on the PCB.

2. Description of the Related Art

A conductive composition material made of an organic polymer, such as polyethylene, and a conductive material, such as carbon black, metal particle or metal powder, has many applications. Among the applications, the resistance variation of a non-linear PTC apparatus is the most outstanding. The characteristic of the PTC apparatuses can be used to design electronic components or electrical apparatuses for protecting circuits from damage by overheating or over-threshold current.

In other words, the resistance of the PTC material is very low at normal temperatures and increases immediately by a magnitude of at least $10^3$ when the temperature is over a threshold or a surge of electrical large current flows through the PTC material. The resistance-varying feature will efficiently suppress or reduce an over-current to protect a circuit from burning off. Another advantage of the PTC apparatus is that when the temperature returns to normal or the over-current disappears, the resistance decreases to its original state of operation again. Unlike the ordinary fuses, which could only trip once and have to be replaced after trip, the PTC apparatus could trip many times and could easily be reset. For the advantage of the resettable characteristics of the PTC apparatus, the PTC apparatus is largely used in high-density electronic circuits.

Nevertheless, it is a trend in the modern high-density circuit design that all components on the circuit board must be small, thin and light and able to be mounted on a surface of the circuit board. Therefore, the PTC apparatus made of conductive polymer material with a pair of conductive metal electrode foils has been designed in a lot of surface-mounted components. For example, U.S. Pat. No. 5,089,801 shows a PTC apparatus and a pair of conductive metal terminals adhered to the conductive electrode on upper and lower planes of PTC apparatus. In a process of manufacturing the prior art PTC apparatus, the stability of adhesion between conductive metal terminal and the planar conductive electrodes on upper and lower planes of the PTC apparatus is a major shortcoming. The disadvantage of the prior art is that the connection between the PTC apparatus and the pair of conductive metal terminals is not strong enough to withstand a reflow process, and usually a disconnection occurs.

U.S. Pat. No. 5,864,281 shows a method in which conductive electrode of metal foils on both surfaces of a PTC apparatus are etched based on a designed pattern until a PTC layer appears. Then, along etched trenches, the PTC apparatus is broken into pieces by external force to form resistance component. This patent emphasizes that the PTC apparatus is made by the manner of breaking. As a result, fractured edges are found in the PTC apparatus. This patent did not teach about how to resolve a thermal conduction problem by changing the structure of the PTC apparatus.

U.S. Pat. Nos. 5,831,510 and 5,852,397 disclose other designs of a PTC apparatus, wherein the design of a pair of electrodes is the same as an ordinary printed circuit board in which an upper electrode is connected to a lower electrode via electroplated with a conductive material. Although the design of these patents overcome the disadvantage disclosed in U.S. Pat. No. 5,089,801 by eliminating a pair of planar conductive metal terminals, the following problems should be overcome:

(1) The apparatus exhibits high heat transfer rate, which causes the resistance of the apparatus to be strongly affected by its environments, such as line width, line thickness and position on the printed circuit board. Therefore, the magnitude of resistance variation from normal ("untripped") state to tripped state becomes unpredictable and hard to control.

(2) Due to the difference of thermal expansion coefficients between a metal electrode and the conductive organic polymer material, the stress embedded in the PTC apparatus is not uniform. Consequently, the metal electrode is susceptible to delamination during service and thereby loses its electrical function.

(3) Each of the electrode foils on the surfaces of the upper and lower end should be separated by etching to form two sections on each of the surfaces. As a consequence, effective area is reduced.

SUMMARY OF THE INVENTION

Accordingly, the objective of the present invention is to resolve the drawbacks of prior arts and to provide with a novel thermal-sensitive resistance apparatus for surface mounting.

In order to achieve the above-mentioned objective, the present invention introduced a novel design and process. The present invention proposes an electrical apparatus for surface mounting, which allocates the electrode films of both planar sides of a normal thermal-sensitive resistance apparatus, such as a PTC apparatus to laminate with an outer electrode layer, and a plurality of vias electroplated with conductive material are used to connect to any plane. It is convenient to mount the apparatus according to the present invention on a printed circuit board.

The present apparatus mainly comprises:

(1) a thin-board resistive component, which (a) is made of a polymer material in which conductive particles are distributed, (b) has a characteristic of positive or negative temperature coefficient, (c) has opposite first and second surfaces, and (d) has opposite first and second end surfaces, respectively extending from the first surface to the second surface;

(2) a first conductive component, disposed on the first surface of said thin-board resistive component and extending to the first end surface;

(3) a second conductive component, disposed on the second surface of said thin-board resistive component and extending to the second end surface;

(4) a first insulating film, disposed on said first conductive component and extending to the second end surface of said thin-board resistive component;

(5) a second insulating film, disposed on said second conductive component and extending to the first end surface of said thin-board resistive component;

(6) a first electrode, including a main body and an interconnection via, wherein said main body includes a pair of metal foils disposed on said first and second insulating films, and said interconnection via includes a conductive film connected to said metal foils and to said first conductive component along the first end surface; and (7) a second electrode, including a main body and an interconnection via, wherein said main body includes a pair of metal foils disposed on said first and second insulating films, and said interconnection via includes a conductive film connected to said pair of metal foils and to said second conductive components along the second end surface.

As well, on the first and second insulating film, (8) a pair of isolating components, such as a solder mask can be further included, which are situated respectively on said first and second insulating films for isolating the first and second electrodes.

Furthermore, the present invention also comprises a multi-layer resistance apparatus, which folds at least two layers of the conductive resistance apparatus, comprising:

(A) a first resistive assembly, including: (1) thin-board resistive components, each of said components has: (a) polymer materials in which conductive particles are distributed; (b) a characteristic of positive or negative temperature coefficient; (c) opposite first and second surfaces; (d) opposite first and second end surfaces, respectively extending from the first surface to the second surface; (2) a first conductive component, disposed on the first surface of said thin-board resistive component and extending to the first end surface; (3) a second conductive component, disposed on the second surface of said thin-board resistive components and extending to the second end surface; (4) a first insulating film, disposed on said first conductive component and extending to the second end surface of said thin-board resistance component; (5) a second insulating film disposed on the second conductive component and extending to the first end surface of said thin-board resistive component.

(B) at least one second resistive assembly of the same structure as said first resistive assembly and superimposed on said first resistive assembly;

(C) a first electrode, including a main body and an interconnection via, wherein said main body includes a pair of metal foils disposed on said first and second resistive assemblies and said interconnection via includes a conductive film connected to the pair of metal foils and to said first conductive components along the first end surface; and (D) a second electrode, including a main body and an interconnection via, wherein said main body includes a pair of metal foils disposed on said first and second resistive assemblies; said interconnection via includes a conductive film connected to the pair of metal foils and to said second conductive components along the second end surface.

Besides, on the first and second resistance assembly, (E) a pair of isolating components, such as a solder mask can be further included, which are situated on the first and second resistance assembly for isolating the first and second electrode.

Different from prior art, the present invention teaches a novel way to construct at least a two-layer resistive apparatus by adhesion, and to eliminate the prior design shortfall that the thermal diffusion of the surface mounting resistance is sensitive to on line width on the circuit board and environments. Additional disadvantages, such as non-uniformity of stress, easy bending of PTC resistive assembly, and variation of resistance due to the difference of thermal expansion coefficients between metal foil electrodes and the conductive polymer material, can be overcome by the designing device with better dimensional stability in the X-Y axis according to the present invention. In prior designs, such as U.S. Pat. Nos. 5,831,510 and 5,852,397, each side of the electrodes must have an etching line, which results in the reduction of the effective area. The present invention only etches small area of first and second conductive components surrounding the second and first end surfaces respectively. This design could increase the effective area and reduce device impedance. The final resistance of the multi-layer apparatus formed by connecting multiple layers in parallel could be reduced, and is equal to the reciprocal of the sum of $1/R_1, 1/R_2, 1/R_3, \ldots, 1/R_n$, wherein $R_1$ to $R_n$ denotes the resistance of resistive assembly layer 1 to resistive assembly layer n respectively.

BRIEF DESCRIPTION OF THE DRAWINGS

The invention will be described according to the appended drawings in which.

PREFERRED EMBODIMENT OF THE PRESENT INVENTION

Figure 1:
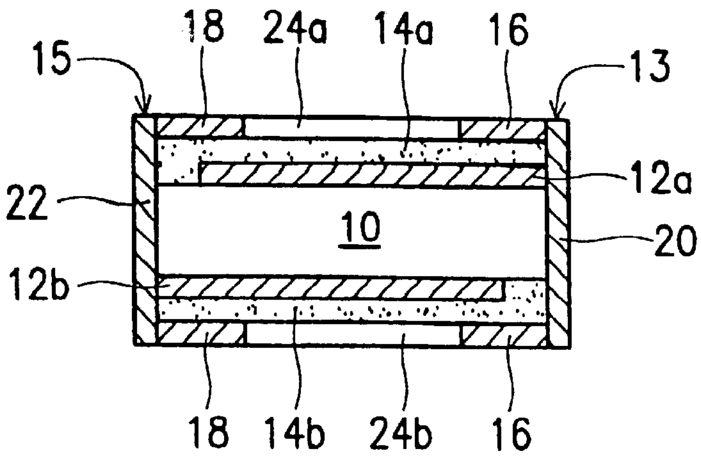
FIG. 1 is a side view of an electrical apparatus according to a preferred embodiment of the present invention.
Figure 2A:
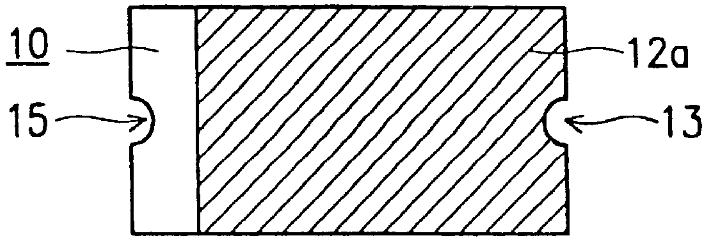
FIGS. 2*a* and 2*b* are a top view and a bottom view of a thin-board resistive component and conductive component in the electrical apparatus.
Figure 2B:
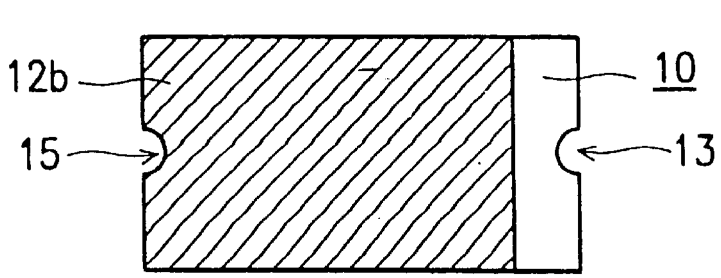

A surface mounted thermal-sensitive resistance apparatus according to a preferred embodiment of the present invention is illustrated by FIG. 1 to FIG. 3. Firstly, FIG. 1 is a side view of the electrical apparatus according to a preferred embodiment of the present invention, and the electrical apparatus shown in FIG. 1 mainly comprises a thin-board resistive component 10, first and second insulating films 14*a* and 14*b*, first and second conductive components 12*a* and 12*b*, and outer electrodes 16 and 18 coupled to the conductive films 20 and 22 respectively.

The resistive component 10 is made of a polymer material with conductive particles dispersed therein and having a characteristic of a positive or negative temperature coefficient. Polymeric materials suitable for the resistive component of the present invention comprises: polyethylene, polypropylene, polyvinyl fluoride, compound and copolymer of the materials mentioned above. The conductive particle can be a metal particle, carbon particle, metal oxide, metal carbide and compounds of the materials mentioned above.

On the top and bottom surfaces of the resistive component 10, the first and second conductive components 12*a* and 12*b* extend respectively to both corresponding sides. Two asymmetric indentations (one indentation is generated by stripping a metal film) are formed on the left side of the first conductive component and the other indentation is on the right side of the second conductive component by an ordinary etching method (such as laser trimming, chemical etching or mechanical method) from a planar metal foil, as shown in FIGS. 2(*a*) and 2(*b*). Materials of the conductive components could be nickel, copper, zinc, silver, gold, tin, lead, alloy and laminated material formed by the materials mentioned above. Besides, although the shape of the indentation in this embodiment is rectangular, other shapes, such as semi-circular, triangular, can also be used in the present invention. According to experiments, the area of the indentation is preferably less than 25% of the total area of one surface of the conductive component.

When the shape of the indentation after stripping is formed, any kind of excellent adhesive films 14*a* and 14*b* (such as an adhesive material made of epoxy and glass fiber, or further comprising polyimide, phenolic and polyester film) is used to adhere through heat and pressure between the resistive component and copper films on the upside and underside thereof. Afterward, both symmetrical electrodes 16 and 18 on the left and right ends are coated and formed by etching the center area of copper films.

The electrodes on the right and left ends 16 and 18 can be optionally electrically connected through interconnection vias 13 and 15 by electroplating, conductive materials on cross sectional end surfaces. Afterward, the intermediate region between the electrodes is coated with solder mask 24*a* and 24*b* to create an insulating effect.

In FIG. 1, the conductive film 20 inside the interconnection via 13 is coupled to two metal foils 16 and the first conductive component 12*a*; and the conductive film 22 inside the interconnection via 15 is coupled to two metal foils 18 and the second conductive component 12*b*. The wall of the interconnection vias can be electroplated with a layer of conductive metal (such as copper, gold, tin, alloy made from tin and lead) by electroless plating and electroplating methods to achieve the purpose of connecting the upper with lower electrodes. The cross-section shape of the interconnection vias could be circular, semi-circular, ¼ circular, arcuate, triangular, rectangular, rhombus or polygon. A semi-circular shape is used in this embodiment.

Figure 3A:
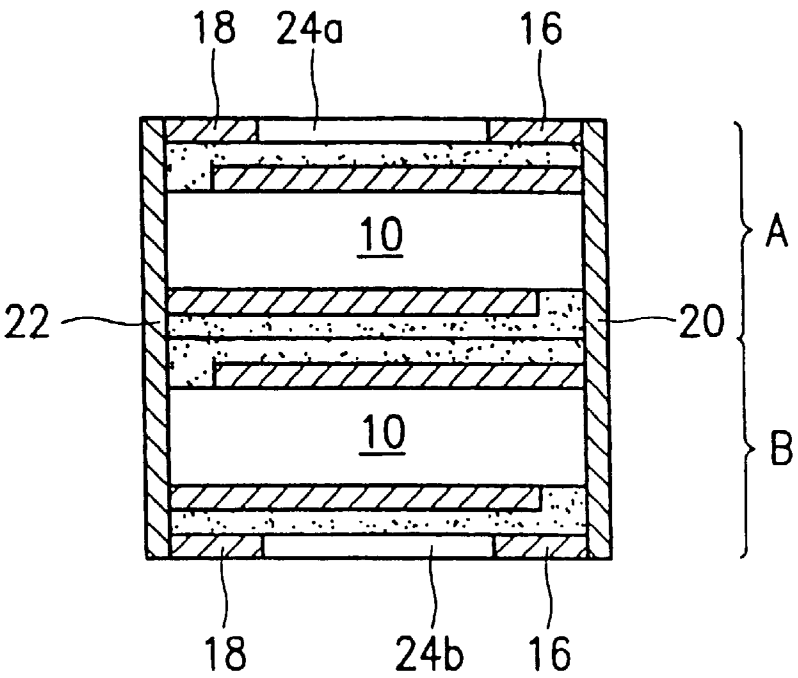
FIGS. 3*a* and 3*b* are a side view of the electrical apparatus of multi-layers (2 layers) according to another preferred embodiment of the present invention and a schematic diagram of its equivalent electrical circuit.
Figure 3B:
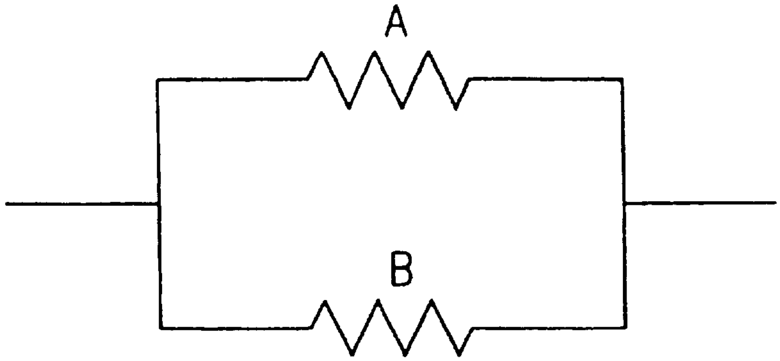

Referring to FIG. 3*a*, the number of resistive components is greater than or equal to two. In FIG. 3*a*, A and B represent two resistive components. The resistive component A is superimposed on the resistive component B, and they are electrically connected in parallel. Every conductive electrode component is electrically connected to others through interconnection vias embedded with conductive films 20 and 22. The surface mounted PTC apparatus according to the present invention has a length of 4.5 mm, a width of 3.1 mm and a thickness of 1.1 mm. Also, two PTC apparatuses are connected in parallel, and equivalent circuit of the PTC apparatuses connected in parallel is shown in FIG. 3*b*. An example of electrical characteristics of the PTC apparatus with two-layer design are listed in the following table.

| Initial resistance (unit: Ω) | The resistance after reflow process at 260° C. and mounted on a circuit board (unit: Ω) | The resistance after cycle life tests. 1 cycle | 10 cycle | 100 cycle | 500 cycle |
|---|---|---|---|---|---|
| 0.059 | 0.086 | 0.097 | 0.085 | 0.082 | 0.089 |

Cycle life test conditions are as follows:

Power source: 7 Volt DC, 40 Amp; 1 cycle: on time 6 sec and off time 60 sec.

The above-described embodiments of the present invention are intended to be illustrated only. Numerous alternative embodiments may be devised by those skilled in the art without departing, from the scope of the following claims.

What is claimed is:

1. A surface mounted electrical apparatus, comprising:

(1) a thin-board resistive component, which is made of polymer material in which conductive particles are distributed, has a characteristic of positive or negative temperature coefficient, has opposite first and second surfaces, and has opposite first and second end surfaces, extending from the first surface to the second surface;

(2) a first conductive component, disposed on the first surface of said thin-board resistive component and extending to the first end surface;

(3) a second conductive component, disposed on the second surface of said thin-board resistive component and extending to the second end surface;

(4) a first insulating film, disposed on said first conductive component and extending to the second end surface of said thin-board resistive component;

(5) a second insulating film, disposed on said second conductive component and extending to the first end surface of said thin-board resistive component;

(6) a first electrode, including a main body and an interconnection via, wherein said main body includes a pair of metal foils disposed on said first and second insulating films, and said interconnection via includes a conductive film connected to said metal foils and said first conductive component along the first end surface; and (7) a second electrode, including a main body and an interconnection via, wherein said main body includes a pair of metal foils disposed on said first and second insulating films, and said interconnection via includes a conductive film connected to said metal foils and said second conductive components along the second end surface. conductive components along the second end surface.

2. The electrical apparatus of claim 1, wherein said polymer material is selected from the group consisting polyethylene, polypropylene, polyvinyl fluoride, a mixture thereof or copolymer of the materials.

3. The electrical apparatus of claim 1, wherein said conductive particle is selected from the group consisting of metal particle, carbon particle, metal oxide, metal carbide and a mixture thereof.

4. The electrical apparatus of claim 1, wherein the conductive component is selected from the group consisting of nickel, copper, zinc, silver, gold, alloy of the materials and a laminated material made from the materials.

5. The electrical apparatus of claim 1, wherein said insulating film is an adhesive material.

6. The electrical apparatus of claim 5, wherein said insulating film is an adhesive material made of epoxy and glass fiber.

7. The electrical apparatus of claim 1, wherein said metal foil is copper foil.

8. The electrical apparatus of claim 1, wherein said conductive film is electroplated with copper or gold by an electroless plating or electroplating method.

9. The electrical apparatus of claim 1, further comprising:

(8) pair of isolating components, disposed respectively on said first and second insulating film for isolating the first electrode from second electrodes.

10. The electrical apparatus of claim 9, wherein said isolating component is a solder mask.

11. A surface mounted electrical apparatus, comprising:

(A) a first resistive assembly, including: (1) thin-board resistive components, each of said components has: (a) polymer materials in which conductive particles are distributed; (b) a characteristic of positive or negative temperature coefficient; (c) opposite first and second surfaces; (d) opposite first and second end surfaces, respectively extending from the first surface to the second surface; (2) a first conductive component, disposed on the first surface of said thin-board resistive component and extending to the first end surface; (3) a second conductive component, disposed on the second surface of said thin-board resistive components and extending to the second end surface; (4) a first insulating film, disposed on said first conductive component and extending to the second end surface of said thin-board resistance component; (5) a second insulating film disposed on the second conductive component and extending to the first end surface of said thin-board resistive component;

(B) at least one second resistive assembly of the same structure as said first resistive assembly and superimposed on said first resistive assembly;

(C) a first electrode, including a main body and an interconnection via, wherein said main body includes a pair of metal foils disposed on said first and second resistive assemblies and said interconnection via includes a conductive film coupled with said metal foils and said first conductive components along the first end surface; and (D) a second electrode, including a main body and an interconnection via, wherein said main body includes a pair of metal foils disposed on said first and second resistive assemblies; said interconnection via includes a conductive film coupled as with said metal foils and said second conductive components along the second end surface.

12. The electrical apparatus of claim 11, wherein said polymer material is selected from the group consisting polyethylene, polypropylene, polyvinyl fluoride, a mixture thereof or copolymer of the materials.

13. The electrical apparatus of claim 11, wherein said conductive particle is selected from the croup consisting of metal particle, carbon particle, metal oxide, metal carbide and a mixture thereof.

14. The electrical apparatus of claim 11, wherein the conductive component is selected from the croup consisting of nickel, copper, zinc, silver, gold, alloy and a laminated material made from the materials.

15. The electrical apparatus of claim 11, wherein the insulating film is an adhesive material.

16. The electrical apparatus of claim 15, wherein the insulating film is an adhesive material made of epoxy and glass fiber.

17. The electrical apparatus of claim 11, wherein said metal foils are copper foils.

18. The electrical apparatus of claim 11, wherein the material of said conductive film is electroplated with copper, gold, tin or alloy made from tin and lead by an electroless plating or electroplating method.

19. The electrical apparatus of claim 11, further comprising:

(E) a pair of isolating components disposed on the first and second resistance assembly for isolating the first electrode from second electrode.

20. The electrical apparatus of claim 19, wherein said isolating component is a solder mask.

* * * * *